(12) United States Patent
Lorenzen et al.

(10) Patent No.: US 6,535,533 B2
(45) Date of Patent: Mar. 18, 2003

(54) MOUNTING SUBSTRATE AND HEAT SINK FOR HIGH-POWER DIODE LASER BARS

(75) Inventors: Dirk Lorenzen, Jena (DE); Friedhelm Dorsch, Zimmern o.R. (DE)

(73) Assignee: Jenoptik Aktiengesellschaft, Jena (DE)

( * ) Notice: Subject to any disclaimer, the term of this patent is extended or adjusted under 35 U.S.C. 154(b) by 173 days.

(21) Appl. No.: 09/798,434

(22) Filed: Mar. 2, 2001

(65) Prior Publication Data

US 2001/0048698 A1 Dec. 6, 2001

(30) Foreign Application Priority Data

Mar. 3, 2000 (DE) .......................... 100 11 892

(51) Int. Cl.⁷ ................................ H01S 3/04
(52) U.S. Cl. .............. 372/34; 372/35; 372/36
(58) Field of Search .............. 372/34, 35, 36, 372/43

(56) References Cited

U.S. PATENT DOCUMENTS

| | | | |
|---|---|---|---|
| 5,299,214 A | 3/1994 | Nakamura et al. | 372/36 |
| 5,309,457 A | 5/1994 | Minch | 372/34 |
| 5,455,738 A | 10/1995 | Montesano et al. | 361/707 |
| 5,812,570 A | * 9/1998 | Spaeth | 372/36 |
| 5,848,083 A | 12/1998 | Haden et al. | 372/36 |
| 5,903,583 A | * 5/1999 | Ullman et al. | 372/35 |
| 5,920,584 A | * 7/1999 | Dohle et al. | 372/36 |

FOREIGN PATENT DOCUMENTS

| | | |
|---|---|---|
| DE | 197 01 680 | 7/1989 |
| DE | 196 05 302 | 8/1997 |
| DE | 195 06 093 | 5/1999 |
| DE | 196 51 528 | 9/1999 |
| DE | 198 21 544 | 12/1999 |
| EP | 0 590 232 | 4/1994 |
| EP | 43 35 512 | 6/1995 |
| EP | 0 898 310 | 2/1999 |
| WO | WO 94/24703 | 10/1994 |

* cited by examiner

*Primary Examiner*—Quyen Leung
(74) *Attorney, Agent, or Firm*—Reed Smith LLP

(57) ABSTRACT

Mounting substrate and heat sink for high-power diode laser bars, the mounting substrate permitting mounting of the high-power diode laser bars by hard-soldering on the basis of a matching expansion to the semiconductor material. The mounting substrate is difficult to bend and of extremely high thermal conductivity, and can be used universally for the various cooling elements of conductive and convective cooling mechanisms.

11 Claims, 3 Drawing Sheets

MOUNTING SUBSTRATE AND HEAT SINK FOR HIGH-POWER DIODE LASER BARS

CROSS-REFERENCE TO RELATED APPLICATIONS

This application claims priority of German Application No. 100 11 892.5, filed Mar. 3, 2000, the complete disclosure of which is hereby incorporated by reference.

BACKGROUND OF THE INVENTION a) Field of the Invention

The invention relates to a mounting substrate and a heat sink for high-power diode laser bars of the type disclosed in U.S. Pat. No. 5,848,083.

b) Description of the Related Art

High-power diode laser bars (HDB) are extended semiconductor laser components of high optical output power (mean line power densities of >1 watt/mm component width, approximately 10 to 100 watts cw per component). Their operation requires high currents of a few 10 to 100 amperes, for which preference should be given in the connecting technique between the HDB and its substrate to hard solders which are highly stable in the long term, rather than to soft solders, which are prone to electromigration. However, by contrast with soft solders, hard solders have the disadvantage that they require a substrate whose lateral coefficient of thermal expansion (in the case of extended chips) must be adapted to better than 1 ppm/K to the material of the HDB, for example GaAs, if it is desired to avoid the influence of damaging mounting stress on the HDB. Such a substrate is termed expansion-matched. Its mounting surface should have a planarity of better than 1 $\mu$m/cm, in order not to worsen the beam formation of the optical emission profile of the HDB by excessive bending of the emitting active zones.

HDB are very sensitive in thermal terms. Their operating temperature should not exceed 55° C. to 60° C., if lifetimes of more than 10,000 hours are required. Consequently, substrates for HDB are designed as heat sinks. For an efficiency of 50%, the power loss occurring during operation is exactly as great as the optical power, and so HDB heat sinks require thermal resistance of from 0.2 to 0.5 K/W (Kelvin per Watt). In principle, HDB heat sinks comprise a heat-spreading mounting substrate and a heat-dissipating cooling element. Copper or diamond, for example, comes into consideration as material for the mounting substrate. A solid copper block on a Peltier element (conductive cooling), a microchannel cooler flowed through by water (MCC, forced or active convective cooling) or a micro heatpipe (MHP) filled with water vapor, free or passive convective cooling) can serve as heat sink. In any case, the mounting substrate can by all means be integrated in the heat sink, as is the case with microchannel heat sinks (MCHS). Thus, microchannel coolers, in particular, have been developed for active (forced) convective cooling with a low thermal resistance, and the use of mounting substrates made from exceptionally highly thermally conductive material— that is to say material exceeding the thermal conductivity value of all known metals—(for example diamond) has been investigated. However, the latter so far have had only led to unsatisfactory life times, because the soldering tensile stress transmitted by the solder onto the HDB are also damaging to the HDB. There have therefore already been many attempts to find highly thermally conductive heat sinks with expansion match. Various arrangements of two or more materials with different coefficients of expansion can achieve expansion matching in at least one direction (parallel to the largest dimension of the laser):

In the case of lateral expansion match, the layering of the materials is performed in a fashion lined up next to one another parallel to the axis of the expansion-matched lateral (width) direction. It is approximately pure in the case of vertically thin layers of large lateral width (EP 0 590 232).

In the case of vertical expansion match, the layering of the materials is performed in a fashion stacked one above another perpendicular to the axis of the expansion-matched lateral (width) direction. It is likewise approximately pure in the case of vertically thin layers of large lateral width (DE 195 06093, DE 196 05 302, U.S. Pat. No. 5,299,214).

In the case of mixed vertical-lateral expansion match, both aspects come into play, specifically by virtue of the fact that both the extent of the expansion-matched direction is limited, as is also the maximum aspect ratio of width to thickness of the material layers. This is the general case, and it goes over into the two previously mentioned types in the limiting case when appropriate extreme values of the layer dimensions are adopted. Typical arrangements for the expansion matching which is clearly of a mixed complexion are a) in the case of regular structures, interruptions in the layers in the case of vertical match in order to weaken its mechanical relevance in comparison to the continuous layers (DE 198 21 544, DE 196 51 528, EP 0 590 232, U.S. Pat. No. 5,848,083 and WO 94/24703).

b) in the case of irregular structures, the homogeneous spatial distribution of particles of low thermal expansion (aluminum nitride, diamond) in a matrix made from a material of high thermal expansion (copper, aluminum) (U.S. Pat. No. 5,455,738 and EP 0 898 310).

The use of expansion-matched heat sink materials made from CuW, CuMo or, as in U.S. Pat. No. 5,455,738, from CuC with C as diamond is disadvantageous because of the still excessively low thermal conductivity and the difficulty of mechanical processing.

An asymmetric two-layer system which consists of continuous diamond and copper (U.S. Pat. No. 5,299,214) is ruled out of application because of its susceptibility to bending. Multilayer systems made from copper/molybdenum/copper (DE 196 05 302) and copper/aluminum nitride/copper (DE 195 06 093) are certainly symmetrical, but still continue to use relatively small thermally conducting metal layers.

Consequently, with reference to mounting substrates made from a multilayer system, the top layer denotes the layer facing the heat source (diode bar laser), and the bottom layer denotes the layer facing the heat sink (metal block, MCC, MHP).

A diamond body with openings having mounting stresses occurring in cutouts transverse to the main directions is presented in DE 197 01 680 for the purpose of decreasing stresses. Mounting it on a microchannel cooler is an example of its integration. The concept of expansion match with such a diamond body is not set forth completely in conjunction with the microchannel cooler. A disadvantage of the diamond body on its own is the still lacking expansion match, and a disadvantage of its combination with a heat sink is the individual match required of the heat sink, tailored to the cooling technique, for bar soldering.

The chip arrangements presented in DE 196 51 528 are based on a (cooling) substrate onto which an HDB is soldered or bonded via a connecting device made from diamond parts spaced apart from one another. A similar arrangement is also found with heat sinks which are presented in DE 198 21 544 and already form per se the expansion-matched component required for HDB mounting.

Both arrangements have the advantage that an additional mounting step can be omitted after the soldering of the bar laser. However, there is a disadvantage of a large number of different heat sinks which have to be prepared for the HDB soldering in a fashion depending on the type of heat sink, and on the volume of substrate material which has to be heated for the HDB soldering. Also disadvantageous, furthermore, is the mechanically strongly asymmetric character of the design, which tends to give rise to bending in production.

On the one hand, EP 0 590 232 presents a mounting substrate which has one vertical layer and consists laterally of alternating layers of materials of high and low thermal conductivity. The thicknesses of these layers can be dimensioned in such a way that the substrate effectively has a coefficient of expansion matched laterally to the semiconductor material. There are certainly few bends in such a mechanically symmetrical substrate, but it has no cooling element for its side averted from the heat-producing component. The indispensable cooling element is, however, a mechanically very influential constituent of each HDB component.

On the other hand, EP 0 590 232 presents a design with two vertical layers and comprising a substrate, which is laterally layered and/or provided with openings or subdivided, and a metal block which serves for the conductive dissipation of heat. Owing to its connection with the substrate, this metal block has a mechanical influence on the HDB with regard to straining and bending. The influence of straining can certainly be minimized by skillful dimensioning of the metal block thickness and substrate thickness in conjunction with the number, position and shape of the cutouts; however, the problem of bending remains unsolved, because of the evident mechanical asymmetry of the design.

A first approach to a solution is presented in U.S. Pat. No. 5,848,083, which has a symmetrical three-layer design of the mounting substrate. It consists of two continuous, thin top and bottom layers similar to the HDB in terms of expansion, and of a massive (bulk) layer in the middle, which contains openings for the reduction of mechanical connection stresses. The middle layer is said in this case to have a higher coefficient of expansion than the two outer ones. All three layers connected to one another result in a mounting module or mounting substrate for the diode laser bar which is expansion-matched.

The effective coefficient of expansion (averaged over the mounting surface of the HDB and active during mounting) of this mounting substrate is essentially determined by the top and bottom continuous layer, specifically the more so, the larger the openings and their number in the middle layer. It holds by analogy for the internal stresses of this module that: they are smaller the larger the openings and their number in the middle layer.

This substrate has the advantage that it does not need to be integrated into an application-specific cooling element until after the HDB soldering. It is, however, disadvantageous that the above-mentioned substrate is still not a constituent of a cooling element which exerts a mechanical influence on the HDB which is mounted or to be mounted. Although it is mentioned that the stress-reducing openings in the middle layer can also be used as coolant channels of a convectively cooling element, there is no proposal for implementing this.

Reference can be made in this regard to the two essential constituents, which can be split in terms of design and operation, of a convectively cooling heat sink: the cooling-relevant constituent and the supply-relevant constituent. The first is limited to the structures effecting thermal dissipation (micro-cooling channels of actively convectively cooling elements or microwick structures in the vaporization range of passively convectively cooling elements including their heat-spreading top layers, which face the heat source); the latter comprises the coolant-conducting or coolant-storing structures without significance for thermal dissipation (inlets and outlets of actively convectively cooling elements, microwick structures in the transport region and vapor chamber of passively convectively cooling elements).

U.S. Pat. No. 5,848,083 contents itself with the integration of the cooling-relevant constituents of an actively convectively cooling element in its mounting substrate; there is no discussion of bonding to the supply-relevant constituent, although this is important in design terms. The emission property of the HDB, which is required by it being mounted on an edge or on a step is important in design terms. Such an edge or step is necessarily a constituent of an expansion-matched mounting substrate. Its height must suffice for mounting a collimation lens, but must be at least so high as to avoid reflection of the emitted light at the substrate surface. In the above-mentioned document, the continuous layer on which the HDB is mounted has a low thermal conductivity in the examples mentioned (Mo, CuW). It must therefore be kept as thin as possible. Moreover, a possible implementation of the continuous layer from diamond is mentioned. This time, it is not thermal reasons which dictate such a layer must be relatively thin, but mechanical ones. In conjunction with an opening-reinforced middle layer made from copper, this layer should only be one tenth of the thickness of the middle layer. If the middle layer has microchannels for liquid cooling of the HDB, a spacing of at least 0.5 mm from the component edge is to be assumed for the microchannel structure. Such a wall thickness is required in order to keep the cooler leakproof, and is likewise a constituent of the expansion-matched mounting substrate like the mounting edge for the HDB. However, in this solution the thickness of the top mounting layer would need to be designed much smaller than said wall thickness. An HDB as edge emitter would therefore always be mounted, at least partially over the wall which is impermeable to coolant and therefore has no openings. The openings essential to the invention in U.S. Pat. No. 5,848,083 are, however, required precisely below the bar laser in order to implement expansion-matched mounting.

If the openings in the solid middle layer are designed on both sides of a continuous layer in the middle layer, it is possible to avoid the problem. In this case, the HDB could be mounted on a step of the height of the thickness of the top layer plus the thickness of the opening-containing (top) layer, facing the top layer, of the middle layer. From a thermal point of view, in the case of virtually expansion-matched top and bottom layers made from CuW or Mo the required enlargement of their layer thicknesses for the purpose of compensating the mechanical influence of the middle layer, which is intensified in this embodiment, is disadvantageous in this variant. The missing thermal function of the bottom layer of the module is unfavourable in this variant in the case of cost intensive, extremely thermally conductive top and bottom layers made from diamond.

It may be dictated in summary that the use of such a mounting substrate according to the prior art as part of a convectively cooling element is disadvantageous by virtue of the fact that the HDB would, in the case of CuW, be mounted on a top layer excessively thin with reference to its optical emission properties and, in the case of diamond, would be mounted on a top layer excessively thin with reference to its thermal requirements.

All the above-mentioned existing solutions for the design of a heat sink for expansion-matched mounting of an HDB are incomplete with regard to the fact that their mechanical properties and their technical implementations depend strongly on the type of heat sink on the side of the mounting substrate averted from the HDB. In the case both of the purely conductive cooling (heat spreading) and of free convective cooling (evaporation cooling) and in the case of forced convective cooling (liquid cooling), the mounting substrate must be connected to the appropriate cooling element. The solutions mentioned are incomplete in that the expansion match and cooling are strongly interdependent in terms of mounting and mechanical design.

OBJECT AND SUMMARY OF THE INVENTION

The primary object of the invention is to find a mounting substrate of very high thermal conductivity for diode laser bars, which permits mounting with hard soldering because of its expansion match to the semiconductor material. It is also an object of the invention to find a mounting substrate which bends little and whose design is mechanically approximately synmmetrical. It is, moreover, an object of the invention to keep the mechanical influence of the required cooling elements on the mounting substrates in the integration as low as possible to form the overall heat sink.

Finally, it is an object of the invention to provide a universal mounting substrate which can be used for the most various cooling elements with conductive and convective cooling mechanisms.

These objects are achieved by a three-layer mounting substrate of the following design:

The top and the bottom layer have a coefficient of thermal expansion which is smaller than that of the HDB. The two layers are equipped with elongated openings which reduce stresses mechanically and are orientated substantially transverse to the HDB width direction; their longitudinal axes form an angle of greater than 45° and less than 135° with the bar width axis. At least the top layer, provided for the HDB mounting on its top side, consists of an exceptionally highly thermally conductive material, in order to keep the thermal resistance of the mounting substrate low.

The middle, continuous layer consists of highly thermally conductive material with an expansion coefficient larger than that of the laser bar. It is advantageous from a thermal point of view to design the mounting substrate in terms of its geometry and its layer properties such that the thickness of the middle layer is less than the sum of the thicknesses of the top and bottom layers.

It is to be stressed that for exceptionally high thermal conductivity the definition concerns exclusively materials whose expansion coefficients are smaller than that of gallium arsenide.

The solution according to the invention permits a mechanically approximately symmetrical design along the thickness axis of the layer system, and thus the required low level of bending. If the top and bottom layers are made from the same materials and have the same stress-reducing openings at the same points in a mirror-image fashion relative to the middle layer, the design according to the invention is mechanically absolutely symmetrical.

Owing to the multiple provision of openings in the bottom and top layers made from exceptionally highly thermally conductive material, for the purpose of expansion matching the solution according to the invention permits the use of an only relatively thin middle layer whose thermally disadvantageous influence on the component to be cooled can be kept small.

The middle layer of the solution according to the invention can in this case have lateral dimensions exceeding the top and bottom layers. Such a design of the middle layer is advantageous when it is used as overlay for a convectively cooling element.

The mounting of an HDB on a mounting substrate according to the invention can be performed before the mounting substrate is connected to a desired cooling element. This solution is advantageous from the point of view of production engineering because it is possible to use one and the same mounting substrate in combination with different cooling elements to implement different application-specific heat sinks, as a result of which the mounting substrate acquires universality of the use. This is so, in particular, when the bottom layer of the mounting substrate is likewise made from a material of exceptionally high thermal conductivity.

Because the top layer of the mounting substrate according to the invention is of exceptionally high thermal conductivity, its thickness can be designed to be so large that it exceeds half the diameter of a lens used to collimate the emerging laser light. Such a lens can therefore be mounted on the middle layer projecting over the top layer.

A thermally conductive metal support can be fitted as cooling element on the underside for the purpose of conductive cooling of the side of the mounting substrate according to the invention averted from the HDB. This is preferably done after the mounting of the HDB on the mounting substrate with the aid of a solder which has a lower melting point than the solder for mounting the HDB. A highly plastic soft solder can be used at this point, so as largely to suppress interaction of the thermomechanical properties between the metal support and the mounting substrate. As a result, no substantial additional mechanical stresses are exerted on the HDB in this second mounting step, nor is there any marked bending.

The openings in the bottom layer can be designed for the purpose of convective cooling in such a way that they can guide a coolant:

In the case of boiling cooling, the openings function as capillary transport and vaporization channels for the coolant. In order to keep a vapor channel free, no contact is made with the underside of the bottom layer. Only the middle layer is connected at its edge to the heat sink, which is an open heat pipe in this case and is provided with its vaporization channels by the mounting substrate, which seals it. The thermo-mechanical influence on the HDB is minimal in the case of this joining technique.

In the case of liquid cooling, the openings function as microchannels with a transfer of heat from their walls into the liquid flowing past. Since heat is transferred to the insides of the openings, in this case the mounting substrate can be bonded into the cooling element with the aid of glue which hardens at room temperature, without the cooling operation being disadvantageously influenced. The gluing is advantageous for the purpose of reducing the thermo-mechanical interaction between cooling element and mounting substrate.

The cooling-relevant constituent (vaporization from microcapillaries, forced heat transfer into microchannels) is already integrated into the mounting substrate for cooling elements for convective cooling. Consequently, constituents of the cooling element (region of convective heat transfer, seal or cap layer of the cooling element) which are extremely influential mechanically and thermally are also already constituents of the expansion-matched mounting substrate.

Connecting the mounting substrate to the thermally negligible supply-relevant constituent of the cooling element for the purpose of convective cooling can be performed via soldering or bonding which reduces the mechanical interaction. The thermal conductivity of this connection plays no role in this case.

Likewise, because of the design separation of cooling-relevant and supply-relevant constituents of the cooling element, the thermal conductivity of the supply-relevant constituent plays no great role any more. It can essentially be selected from mechanical points of view.

The invention is to be explained in more detail below with the aid of three exemplary embodiments.

DESCRIPTION OF THE PREFERRED EMBODIMENTS

Figure 1:
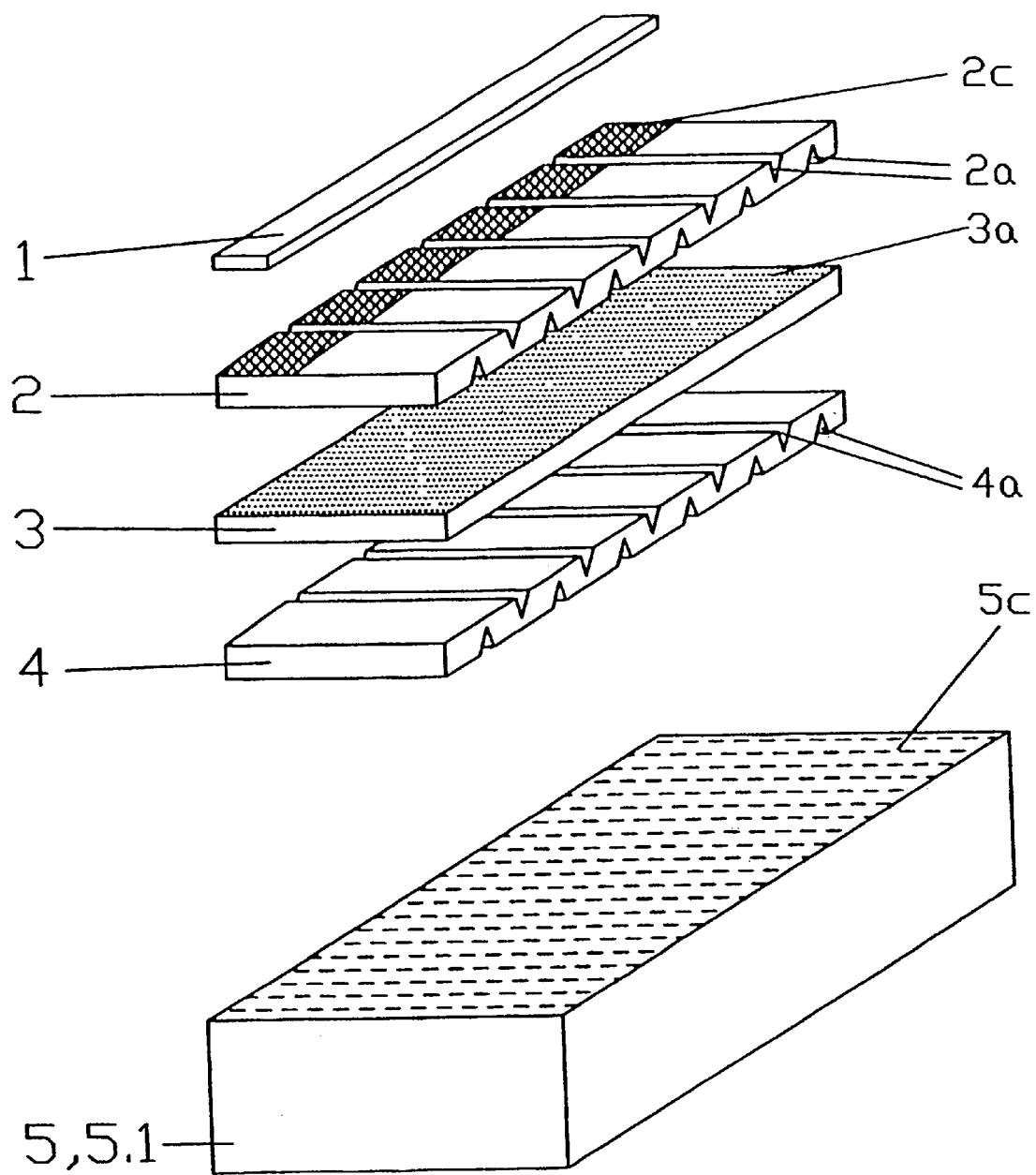
FIG. 1 shows a first exemplary embodiment for a mounting substrate and a cooling element for conductive cooling, in an exploded representation.

The first exemplary embodiment, illustrated in FIG. 1 comprises the mounting substrate, consisting essentially of a top layer 2, a bottom layer 4, both consisting of diamond with a thickness of 300 µm, a width of 10 mm and a length of 3 mm, and a middle layer 3, an HDB 1 and a cooling element 5. Provided in the two layers 2 and 4 by means of a laser are elongated openings 2a and 4a which, in this exemplary embodiment, constitute grooves which, in a fashion arranged offset relative to one another, cut into the layer to a depth of approximately ⅔ of the layer thickness over the entire length thereof. Both layers 2 and 4 are coated completely with a solderable metallization. The middle layer 3 is a continuous layer consisting of copper with a thickness of 300 µm, a width of 10 mm and a length of 3 mm, and is provided on both sides with a hard solder 3a containing a high proportion of gold. All three layers 2, 3 and 4 are connected to one another in a first soldering process and form the expansion-matched mounting substrate for the HDB mounting. Said substrate is built up to a required conductor thickness in an electroplating process using gold, in order to conduct the high electric currents prevailing in the HDB operation. Subsequently, a second solder 2c, which serves a purpose of soldering an HDB 1 to the mounting substrate in a second soldering process, is applied to the top side of the mounting substrate.

A thermally conductive metal support, here specifically a copper block 5.1, which can bear on its underside one or more Peltier elements for heat dissipation, serves as cooling element 5 for conductive cooling. A third solder 5c, preferably a very plastic soft solder, is applied to this copper block 5.1 at the point provided therefor. The mounting substrate is soldered on there in a third soldering process.

Together, the mounting substrate according to the invention and the cooling element 5 for conductive cooling form an HDB heat sink according to the invention.

A variant of the first embodiment consists in using an integrated cooling element which cools convectively in a free or forced fashion, instead of the solid copper block. Such a variant is advantageous from the point of view of saving weight and volume for the overall heat sink, and permits stackability.

Figure 2:
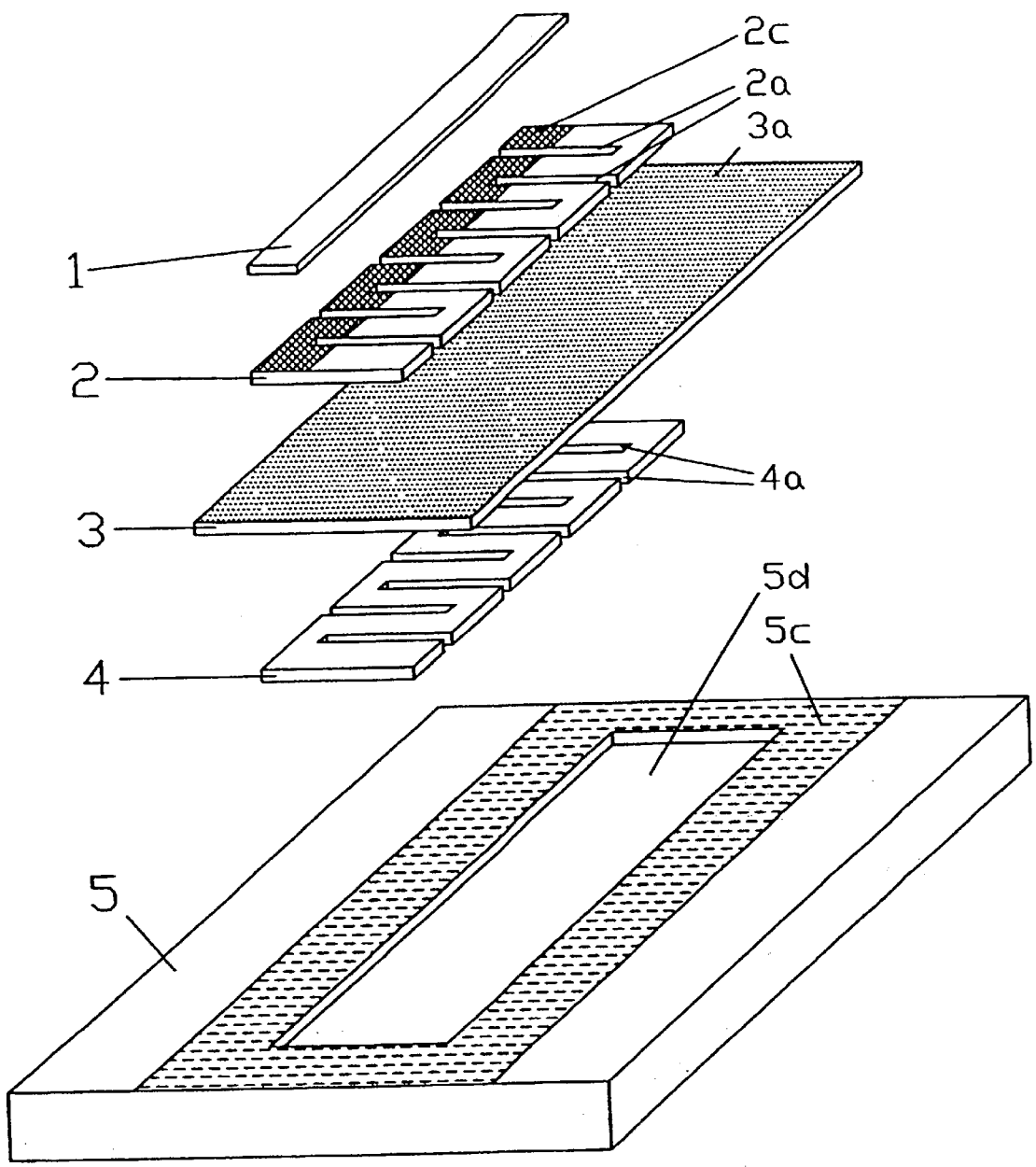
FIG. 2 shows a second exemplary embodiment for a mounting substrate and a cooling element for convective cooling, in an exploded representation.

The second exemplary embodiment illustrated in FIG. 2 differs from the first essentially by the use of a cooling element for passive convective cooling, and in a different structure, resulting therefrom, of the top and bottom layers 2 and 4. The top and bottom layers 2 and 4 are made from diamond and have a thickness of 200 µm, a width of 10 mm and a length of 4 mm, and have as elongated openings 2a and 4a channels which are cut out through the layer, starting from the broad sides of the layers in a fashion parallel to the longitudinal axis of the layers and reciprocally over ⅘ of the length of the layer. The middle layer 3 is a continuous layer made from copper with a thickness of 100 µm, a width of 14 mm and a length of 8 mm, and is provided on both sides with a layer of active solder 3a. All three layers 2, 3 and 4 are interconnected in a first soldering process in such a way that the two layers 2 and 4 are each placed in the middle on a side of the middle layer 3. The soldered three-layer system forms the expansion-matched mounting substrate for the HDB mounting. A layer thickness of gold required for current conduction is sputtered onto the top side of the mounting substrate, as is a second solder 2c, preferably a hard solder containing a high proportion of gold, which serves to solder the HDB1 in a second soldering process.

An as yet unfilled, open heat pipe made from copper and having an incomplete capillary structure serves as supply-relevant constituent and coolant container of a cooling element 5 for passive convective cooling. The capillary structure and cooling element 5 are completed by the bottom diamond layer 4 of the mounting substrate, into which the evaporant liquid can be sucked up by capillary action into the longitudinal openings 4a from the two broad sides, and by the middle layer 3, functioning as cover layer, of the mounting substrate. By using the mounting substrate with bonding via an adhesive layer 5c along the free copper edge of the opening to the vapor chamber 5d of the heat pipe, the cooling element 5 is closed on the underside of the copper middle layer, subsequently filled and sealed. In conjunction with the absorption of heat, the liquid can be vaporized from the elongated openings 4a in the bottom diamond layer 4.

The mounting substrate according to the invention forms an overall heat sink according to the invention with the cooling element 5 for passive convective cooling.

A variant of the second embodiment consists in replacing the bottom diamond layer 4 of the mounting substrate by a layer made from silicon. Silicon permits other microstructure geometries and has other wetting properties. Both aspects can lead to an improvement in the cooling properties of the overall heat sink.

Figure 3:
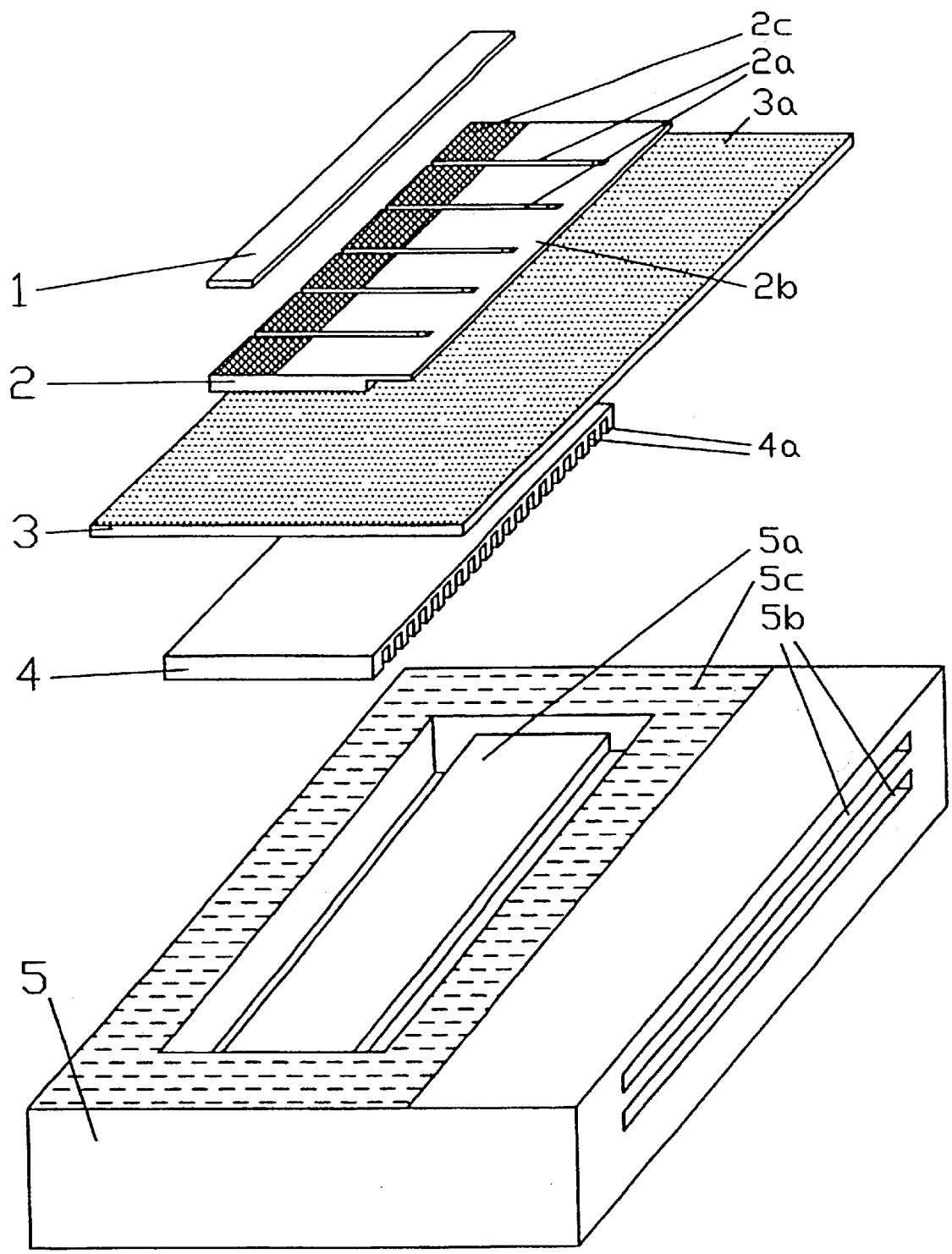
FIG. 3 shows a third exemplary embodiment for a mounting substrate and 9 heat sink for convective cooling, in an exploded representation.

The third exemplary embodiment illustrated in FIG. 3 differs from the preceding exemplary embodiments, through the use of a cooling element for active convective cooling, and a different structure, resulting therefrom, of the top and bottom layers 2 and 4.

In the top layer 2, consisting of diamond, with a thickness of 300 µm, a width of 10 mm and a length of 3 mm, the elongated openings 2a are constructed as channels cut through the layer, starting in each case from a broad side of the layer parallel to the longitudinal axis of the layer and on one side over ⅞ of the length of the layer. The partially uncut ¼ of the length of the top layer 2 is thinned down to approximately half of its length transverse to the channels. This thin connecting web 2b serves as a break point for separating the diamond finger structure produced into corresponding unconnected partial layers after connection to the middle layer 3.

One hundred channels 4a with a width of 50 μm and a depth of 300 μm are provided by means of anisotropic etching (microchannel structure) as elongated openings 4a in the bottom layer 4, consisting of silicon, with a thickness of 400 μm, a width of 10 mm and a length of 5 mm. The bottom layer 4 is sputtered—on its continuous side—with the layer thickness of gold required for soldering; the layer 2 is additionally sputtered on its top side. The middle layer 3 consists of silver with a thickness of 200 μm, a width of 12 mm and a length of 7 mm, is continuous and is provided on both sides with a layer of hard solder 3a. All three layers 2, 3 and 4 are interconnected in a first soldering process in such a way that the bottom layer 4 terminates in the vertical direction on one side with the top layer 2, and projects on the other side 2 mm over the top layer 2. The connecting web 2b, which still keeps the diamond finger structure connected on the broad side, is broken off at the rupture joints. The soldered three-layer system forms the expansion-matched mounting substrate for HDB mounting. A layer thickness of gold required for current conduction is applied by electroplating to the top side of the mounting substrate, and a second solder 2c, preferably a hard solder containing a high proportion of gold, is sputtered on, its task being to solder the HDB1 onto the front end of the top layer 2 in a second soldering process. Since the bottom layer 4 projects over the front end of the top layer 2, heat spreading and cooling can also take place in the direction of emission of the HDB1.

A flat structured cooling element 5, approximately 1.5 mm high, made from stainless steel, which conducts coolant and has coolant inlet and outlets 5b, serves as supply-relevant constituent of a cooling element 5 for active convective cooling. The cooling-relevant constituents of the cooling element 5 for active cooling, the microchannel structure for enlarging the heat-transferring surface are provided by the bottom layer 4 of the mounting substrate, whose front broad side can serve, for example as coolant inlet into the microchannel structure, and whose rear broad-side can serve as coolant outlet. The mounting substrate is installed in the heat sink 5 by bonding with the aid of an adhesive layer 5c, in the case of which the edges, projecting over the top layer 4, of the middle layer 3 are bonded to the edge of the steel support, and the underside of the bottom layer 4 is also bonded to the opposite surface 5a of the cooling element 5 in order to increase the stability. The mounting substrate according to the invention forms an overall heat sink according to the invention with the cooling element 5 for active convective cooling.

A variant of the third embodiment consists in implementing the bottom layer 4 from diamond instead of from silicon, using the same geometry as the top layer 2 of the mounting substrate. This variant is advantageous because it permits a design which is completely symmetrical in thermal and mechanical terms.

The exemplary embodiments set forth represent only a short excerpt from a multiplicity of possibilities according to the invention for implementing the mounting substrate and an overall heat sink containing this mounting substrate. A series of other arrangements with the feature according to the invention are conceivable.

In particular, on the one hand the middle layer 3 can consist of a plurality of sublayers which, for their part, can in turn partly include openings which reduce stresses. It is essential to the invention that the coefficient of thermal expansion, resulting in the multilayer assembly, of the middle layer is greater than that of the bar laser.

On the other hand, the top and bottom layers 2 and 4, which are equipped with elongated openings, can bear on their top side and underside further layers (soldering preforms, diffusion layers or thick-film conductors) whose mechanical influence on the expansion-matched action, according to the invention, of the mounting substrate is negligible, and whose functions are essentially joining and electrical functions. Thus, for example, the gold current-conducting layer applied by electroplating to the top side of the top layer 2 could be replaced by a continuous copper film soldered thereon whose electric and thermal properties even surpass those of gold.

While the foregoing description and drawings represent the present invention, it will be obvious to those skilled in the art that various changes may be made therein without departing from the true spirit and scope of the present invention.

What is claimed is:

1. A mounting substrate for high-power diode laser bars (HDB), comprising:
    a top layer which serves as mounting surface for the HDB;
    a middle layer; and
    a bottom layer, which serves as mounting surface for a cooling element or is a cooling-relevant constituent of a cooling element;
    said top layer and said bottom layer consist of materials with a coefficient of thermal expansion which is smaller than that of the HDB, and have elongated openings which are oriented substantially transverse to the bar width direction;
    at least the top layer consists of a material of exceptionally high thermal conductivity; and
    said middle layer consists of a material or a combination of materials whose coefficient of thermal expansion is greater than that of the HDB.

2. The mounting substrate as claimed in claim 1, wherein the middle layer is thinner than the sum of the layer thicknesses of the top layer and the bottom layer.

3. The mounting substrate as claimed in claim 1, wherein the elongated openings of the top layer are provided along the resonators of the HDB to be mounted, and are tuned to the emitter spacing in the HDB.

4. The mounting substrate as claimed in claim 3, wherein the elongated openings of the bottom layer are also provided along the resonators of the HDB to be mounted, and are periodically tuned to the emitter spacing in the HDB.

5. The mounting substrate as claimed in claim 1, wherein the middle layer consists of copper.

6. The mounting substrate as claimed in claim 1, wherein the top layer consists of diamond.

7. The mounting substrate as claimed in claim 1, wherein the top layer and the bottom layer consist of the same material.

8. The mounting substrate as claimed in claim 1, wherein the middle layer has larger lateral dimensions than the top layer and the bottom layer.

9. A heat sink for cooling an HDB having a mounting substrate and a cooling element, wherein the mounting substrate corresponds to claim 1.

10. The heat sink as claimed in claim 9, wherein the elongated openings serve as capillaries for the liquid to be vaporized, and the cooling element is a cooling element for passive convective cooling.

11. The heat sink as claimed in claim 9, wherein the elongated openings serve as micro-cooling channels for the coolant flowing through, and the cooling element is a cooling element for active convective cooling.

* * * * *